United States Patent [19]

Fawcett

[11] Patent Number: 6,161,077
[45] Date of Patent: Dec. 12, 2000

[54] PARTIAL DISCHARGE SITE LOCATION SYSTEM FOR DETERMINING THE POSITION OF FAULTS IN A HIGH VOLTAGE CABLE

[75] Inventor: Timothy J. Fawcett, Runcorn Cheshire, United Kingdom

[73] Assignee: Hubbell Incorporated, Orange, Conn.

[21] Appl. No.: 09/225,305

[22] Filed: Jan. 5, 1999

[51] Int. Cl.[7] .................................................. G01R 31/00
[52] U.S. Cl. ............................ 702/58; 702/59; 324/523; 324/528
[58] Field of Search ................................. 702/58, 59, 66; 324/512, 522, 523, 527, 528, 532, 533, 534, 535, 536, 541

[56] References Cited

U.S. PATENT DOCUMENTS

| | | |
|---|---|---|
| 4,887,041 | 12/1989 | Mashikian et al. . |
| 4,897,607 | 1/1990 | Gruenwald et al. . |
| 4,949,001 | 8/1990 | Campbell . |
| 4,967,158 | 10/1990 | Gonzalez . |
| 5,256,976 | 10/1993 | Ishikawa et al. ............... 324/522 |
| 5,272,439 | 12/1993 | Mashikian et al. . |
| 5,352,984 | 10/1994 | Piesinger ........................ 324/532 |
| 5,416,418 | 5/1995 | Maureira et al. . |
| 5,481,195 | 1/1996 | Meyer . |
| 5,530,364 | 6/1996 | Mashikian et al. . |
| 5,600,248 | 2/1997 | Westrom et al. ................ 324/522 |
| 5,682,100 | 10/1997 | Rossi et al. ..................... 324/535 |
| 5,767,684 | 6/1998 | Steennis . |
| 5,814,998 | 9/1998 | Gruenewald et al. ........... 324/536 |

OTHER PUBLICATIONS

Zondervan et al., "Processing of Apparent Discharge Magnitude for Digital Partial Discharge Detectors", IEEE, 1996.
Hucker et al., "Requirements of Automated PD Diagnosis Systems for Fault Identification in Noisy Conditions", IEEE, 1995.
DDX Digital Partial Discharge Detector, Product Brochure, Hipotronics, Inc., Apr. 1998.
970 Series System Controller Product Brochure, Hipotronics, Inc., Sep. 1997.

*Primary Examiner*—Patrick Assouad
*Attorney, Agent, or Firm*—Jerry M. Presson; Stacey J. Longanecker; Alfred N. Goodman

[57] ABSTRACT

A pulse discharge site location (PDSL) system is provided which captures pulses on a conductor without requiring the triggering functions of an oscilloscope. The PDSL system comprises a pulse discharge measurement (PDM) system and is programmed to store the data captured by the PDM system in a reference buffer corresponding in size to the propagation time of a pulse along the length of the conductor. Samples of the captured pulses are scanned to locate the peaks of pulses above a selected noise level. These pulses are stored into a temporary working buffer, along with a selected number of samples, normalized and then added to the reference buffer. The reference buffer provides a statistical average of pulse activity. Primary pulses and their second and higher order reflections, as well as transient interference pulses and radio frequency interference, are indicated at the beginning and end of the reference buffer. Reflections of first reflected pulses from fault sites in a conductor are represented in the remaining portion of the reference buffer. Fault site distances from the end of the cable can be determined due to the proportional dimension of the reference buffer with respect to the length of the cable and cable propagation time.

11 Claims, 6 Drawing Sheets

PARTIAL DISCHARGE SITE LOCATION SYSTEM FOR DETERMINING THE POSITION OF FAULTS IN A HIGH VOLTAGE CABLE

CROSS REFERENCE TO RELATED APPLICATIONS

Related subject matter is disclosed and claimed in co-pending U.S. patent application Ser. No. 09/095,091, filed on Jun. 10, 1998, and entitled "System For Digital Measurement Of Breakdown Voltage Of High Voltage Samples"; in co-pending U.S. patent application Ser. No. 09/095,092, filed on Jun. 10, 1998, and entitled "System For Measuring Partial Discharge Using Digital Peak Detection"; and in co-pending U.S. patent application Ser. No. 09/095,093, filed Jun. 10, 1998, and entitled "System for Concurrent Measurement of Peak Voltage and RMS Voltage in High Voltage System"; all of said applications being expressly incorporated herein by reference.

FIELD OF THE INVENTION

The invention relates to a system for determining the location of faults using multiple passes of pulse activity on a conductor being tested and averaging of detected pulse activity. The invention also relates to a system which performs partial discharge measurement and enhanced data acquisition using multiple passes of pulses and averaging without requiring the pulse triggering function of a digital oscilloscope.

BACKGROUND OF THE INVENTION

Partial discharge may occur along cables in electric power transmission and distribution systems when cable insulation breaks down. For example, a cavity in cable insulation can cause partial discharges under normal operating conditions and test conditions when the cable is energized, that is, when high voltage signals are introduced into the cable. When a partial discharge (PD) occurs, high frequency current and voltage pulses emanate from the site of the discharge, which is hereinafter referred to as a fault site. These current and voltage pulses can be useful as an indication of the presence of a fault (e.g., an insulation defect) for partial discharge site location and assessment. The type of cable fault that causes PD is non-reversible and damage to the cable progressively degrades the insulation until a catastrophic failure occurs. A cable that is exhibiting PD and is unattended deteriorates due to a combination of factors such as moisture ingression, mechanical fatigue and thermal cycling, among others. It is most cost effective to monitor the cable at the time of manufacture and once installed to detect partial discharge activity and determine its location as soon as such conditions arise to allow for preventive maintenance to be performed before catastrophic failure occurs.

Partial discharge site location (PDSL) is a technique for determining the position of a fault within a high voltage (HV) cable by using detection means at a near end of the cable to detect pulses which are generated by PD within the fault. The reflection of those pulses from the far end of the cable is also detected at the near end. The time difference between the PD pulse and its reflected pulse is proportional with respect to the distance of the fault site from the far end of the cable.

An existing partial discharge measurement (PDM) system employs a relatively simple discharge site location system which allows a user to perform a single time-related capture of pulse activity on a sample cable being tested. A user can employ the graphic user interface and processing capability of the PDM system to zoom in on pulses and their reflections and to determine the position of a fault within the cable. This single time-related capture technique has some deficiencies when compared with other equipment such as a digitizing oscilloscope. Since the above-described technique is a single shot process, no averaging of the data occurs. Thus, the PDM system sensitivity is limited by the non-correlated noise on the system. A digitizing oscilloscope is advantageous in that it can average pulse activity by digitizing the pulse activity in short bursts based on its time-base setting in response to a triggering event created by the presence of a pulse. These short bursts of digitized pulse activity represent multiple passes of the cable being tested in contrast a single time-related capture. The result of these digitizing operations of multiple passes are averaged together to produce a composite image of the pulse activity. An additional benefit of a digitizing oscilloscope is that it allows the possibility of resolving the presence of multiple sites within the cable.

To provide the performance of a digital oscilloscope in a PDM system by mimicking the operation of a digital oscilloscope using pulse triggering is not a viable option since the PDM system would need to be redesigned to include features that may not be currently included in the PDM system hardware such as a settable threshold detection operation on the incoming data stream with an additional data path to process the threshold signals. Such a redesign is not desirable since it may compromise the partial discharge detection and measurement facilities that are already included in the PDM system. The PDM system is designed to operate on a pulse-by-pulse basis to identify individual pulse events rather than relying on a repetitive signal, as is typically used for PDSL measurement. The redesign would involve considerable effort and expense to include the triggering system of an oscilloscope, as well as a philosophical change to the operation of the PDM system. The PDM system would change from an essentially free-running system to a triggered system so that, rather than looking for events in terms of peak heights (i.e., the factor of interest), the system would detect events crossing a defined threshold. This presents problems for PDM because of a possibility that events will be overlooked for failure to meet the trigger criteria. Accordingly, a need exists for a PDM system which can perform pulse averaging for PDSL without triggering and other operations associated with oscilloscopes.

SUMMARY OF THE INVENTION

In accordance with the present invention, a single digitization system is provided which allows both PDSL and PDM. Software processing of the information generated by a PDSL system is enhanced to perform averaging functions such as those provided by a digital oscilloscope, as well as provide automation of the PDSL measurement process. An enhanced PDSL system is implemented in accordance with the present invention to provide a combination of accuracy, tolerance to noise and ease of use to the PDSL process.

In accordance with another aspect of the present invention, the software processing of the enhanced PDSL system is adapted for use with conventional time domain reflectometry CTDR) systems without a PD measurement capability to enhance functionality in the same way.

In accordance with the present invention, a PDSL system is provided to determine cable propagation velocity, as well as a method for using same. The PDSL system introduces a calibration pulse (i.e., a pulse of insufficient power to cause discharge at faults) into a cable to be tested, and data capture operations are performed to relate the time required for a pulse to travel the full length of a cable being tested to the length of that cable.

In accordance with yet another aspect of the present invention, a method is provided for applying an excitation pulse to a conductor being tested and for obtaining a statistical sum of pulse activity on the conductor in response to the excitation pulse. The statistical sum is obtained from buffering whereby pulse propagation time, cable length traveled by pulses and buffer positions for storing data relating to the pulses are correlated such that pulse activity including reflections and interference occurring in a conductor being tested is represented in predictable buffer positions.

In accordance with the present invention, a method is provided for determining the location of fault sites in a conductor. A PDSL system comprises a pulse discharge measurement (DM) system and is programmed to store the data captured by the PDM system in a reference buffer corresponding in size to the propagation time of a pulse along the length of the conductor. Samples of the captured pulses are scanned to locate the peaks of pulses above a selected noise level. These pulses are stored into a temporary working buffer, along with a selected number of samples, normalized and then added to the reference buffer. The reference buffer provides a statistical average of pulse activity. Primary or excitation pulses and their reflections, as well as transient interference pulses and radio frequency interference, are indicated at the beginning and the end of the reference buffer. Reflections of pulses from fault sites are represented in the remaining portion of the reference buffer. Fault site distances from the end of the cable can be determined due to the proportional dimension of the reference buffer with respect to the length of the cable and cable propagation time.

BRIEF DESCRIPTION OF DRAWINGS

The various aspects, advantages and novel features of the present invention will be more readily comprehended from the following detailed description when read in conjunction with the appended drawings, in which.

Throughout the drawing figures, like reference numerals will be understood to refer to like parts and components.

DETAILED DESCRIPTION OF THE PREFERRED EMBODIMENTS

Figure 1:
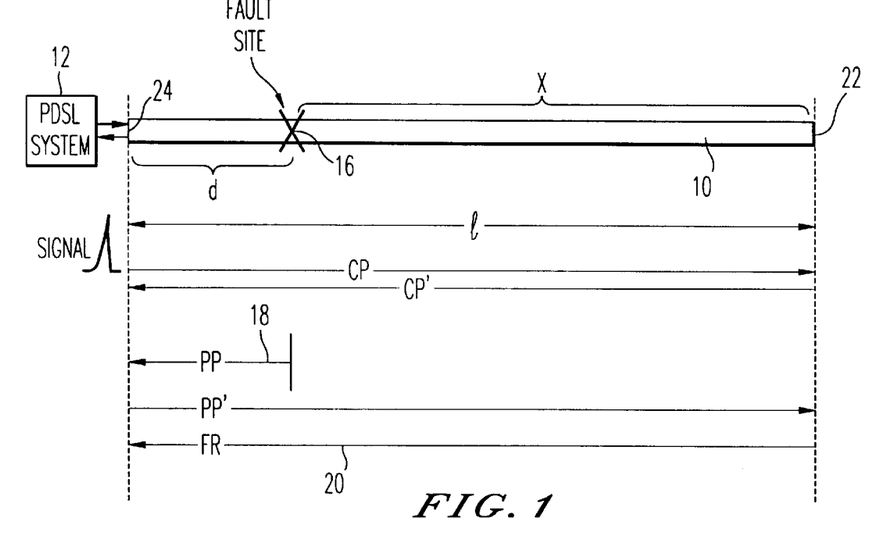
FIG. 1 illustrates the configuration of a conductor and a PDSL system constructed in accordance with an embodiment of the present invention to locate faults in the conductor.

With reference to FIG. 1, an exemplary electrical conductor 10 is illustrated, which is hereinafter referred to as a cable for illustrative purposes. It is to be understood that the system and method of analyzing pulse activity of the present invention can be used in a connection with the testing of different media and different types of test signals. In the illustrated example, high voltage signals are used as test signals. A PDSL system 12 is connected to the near end of the electrical conductor 10 and is operable to introduce low voltage pulses (CP) therein for calibration. The PDSL system 12 also energizes the electrical conductor 10 using high voltage AC or DC signals. The electrical conductor 10 is therefore energized to the point where any faults 16 in the electrical conductor 10 discharge and generate pulses that are measured by the PDSL system 12. A cable that is undergoing testing such as PDSL in a real environment is subject to a number of forms of pulse activity which all have an influence on the measurement of the position of the discharge source.

A primary pulse (PP) is a discharge pulse from a fault site that has propagated down the cable toward the measuring end without being reflected. The path 18 of the PP is depicted in FIG. 1. The first reflection (FR) is the pulse PP' that has propagated along the cable to the far end 22 (i.e. the end that is furthest from the measuring point 24), has been reflected at the far end 22 and, consequently, has traveled toward the measuring end 24 (i.e., as exemplified by path 20). The time difference between the two pulses PP and FR is proportional to the distance X between the far end 22 of the cable and the fault site 18. This time difference is useful when performing PDSL measurements.

In accordance with the present invention, the PDSL system 12 performs PDSL in an optimal manner by measuring the PP and the FR while rejecting essentially all other forms of pulse activity detected along the cable. The FR pulse ordinarily has a lower magnitude than the PP because of the attenuation of the cable. The effect is offset somewhat by the positive reflection coefficient at the far end 22 of the cable 10. When the attenuation is low, the FR pulse is generally larger in magnitude than the primary pulse. The PDSL system 12 of the present invention is preferably a measurement system which takes this difference in magnitude into account.

Figure 2:
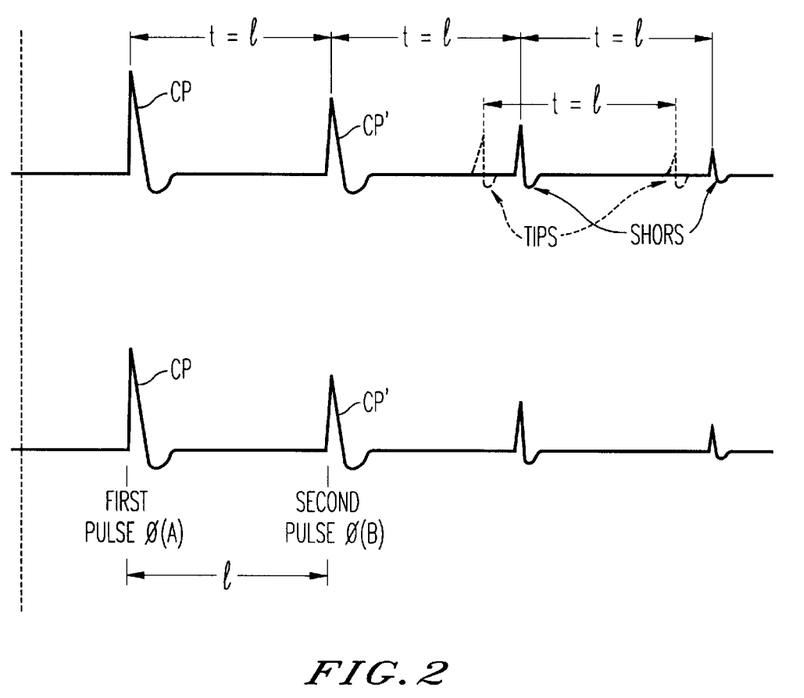
FIG. 2 illustrates pulses and reflected pulses analyzed using a PDSL system during length calibration in accordance with an embodiment of the present invention.

Second and higher order reflections (SHOR), as illustrated in FIG. 2, result when the discharge pulse (e.g., the PP) from a fault 16 reflects along the cable 10 from both the near end 24 and the far end 22, decreasing in size as the cable 10 attenuates. Accordingly, multiple reflection pulses can be detected following the FR pulse. SHORs are therefore characterized by equally spaced pulses. The time difference between SHOR pulses is proportional to the length of the cable 10. These SHOR pulses are spaced from the PP by the same amounts t or l which are related as described below in connection with FIG. 9.

Transient interference pulses (TIPs) can be coupled into the measurement system of the PDSL system 12 from the external environment via the cable 10 or the air, for example.

These TIPs manifest themselves as pulses on either the near end 24 or the far end 22 of the cable 10. TIPs consist of a pulse with one or more reflections. The time spacing of these reflections is also proportional to the length of the cable and therefore the same as that for SHORs, as illustrated in FIG. 2. The TIPs are distinguishable from SHORs, however, in that they are not correlated to the PP and the FR. The TIPs occur randomly with respect to the PP and the FR, as shown in phantom in FIG. 2 for illustrative purposes.

Radio frequency interference (RFI) can be coupled onto the PDSL system as a result of operating in an open, or an only partially shielded environment. As a result, spot frequencies or frequencies with sidebands can be coupled onto the cable 10. This has the effect of increasing the background noise level of the system, which may result in reflections being obscured, especially when the attenuation of the cable 10 is high. Because of the non-stochastic nature of discharge activity, even if the RFI is correlated with the line frequency, it will not be correlated to the PP and the FR. Thus, the RFI can be eliminated using averaging.

Figure 3:
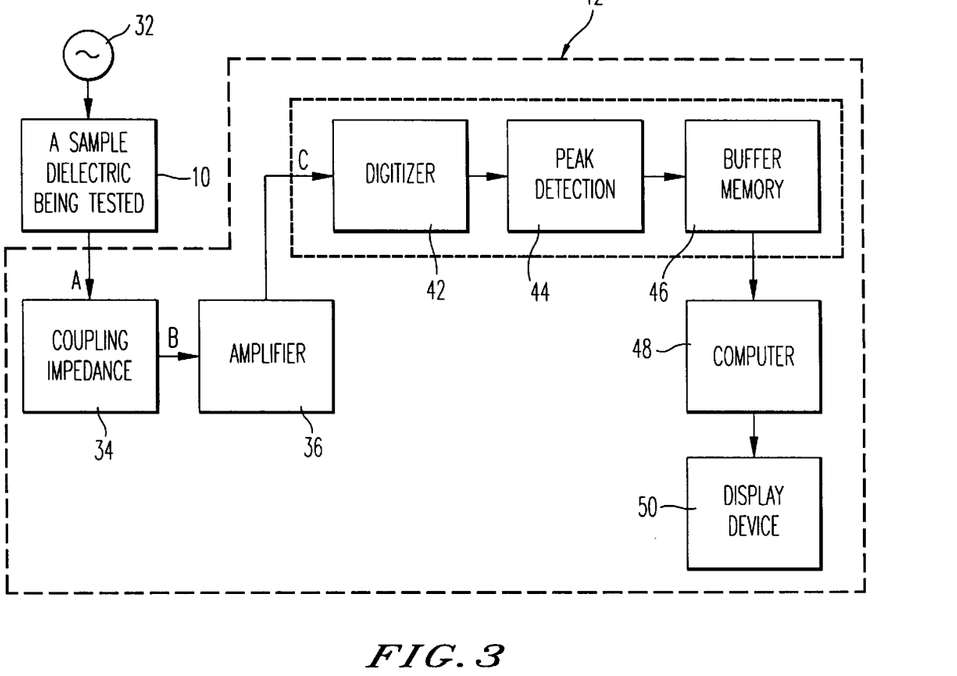
FIG. 3 is a block diagram of a PDSL system constructed in accordance with an embodiment of the present invention.
Figure 4:
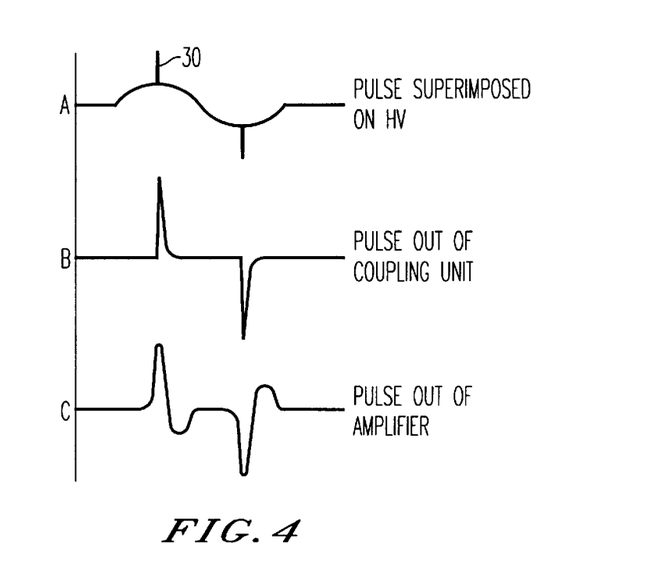
FIG. 4 illustrates waveforms in the PDSL system depicted in FIG. 3.

The PDSL system 12 comprises a digital peak detection measurement system 30 and means for generating high voltage signals 32. Alternatively, the PDSL system 12 is operable with an external high voltage power supply. A high voltage power supply which can be incorporated into or connected to the PDSL system is, for example, any of the power supplies based on the 970 Series system controller available from Hipotronics, Inc., Brewster, N.Y. A block diagram of a digital partial discharge measurement (PDM) system 30 which implements digital peak detection in the PDSL 12 and operates in accordance with the present invention is depicted in FIG. 3. Signal waveforms A, B and C at the outputs of various components in the PDM system 30 are illustrated in FIG. 4. Applications for the PDM system 30 include, but are not limited to, testing and monitoring power cable, distribution and power transformers, medium and high voltage switch gear, power circuit breakers, gas insulated switch gear, bushings, shunt reactors, potential and current transformers, power factor correction capacitors, line insulator products, lightning arrestors, among other high voltage components and insulating materials of all types.

A sample (e.g., an insulation system sample such as the cable 10) which is to undergo partial discharge detection using the PDM system 30 is connected to a coupling impedance 34. The PDM system 30 is preferably not steady-state and pulses are frequently superimposed on the high voltage waveform conducted across the sample 10 from a high voltage source 32. With reference to FIG. 3, the waveform provided to the coupling impedance 34 is illustrated as waveform A. The magnitude of the pulse 36 superimposed on the high voltage waveform A has been exaggerated for illustrative purposes. The output of the coupling impedance 34 is depicted as waveform B in FIG. 3. Following processing by amplifier 36, the pulse can appear as the waveform C in FIG. 3.

With continued reference to FIG. 2, digital peak detection is performed by a peak detection circuit 40 comprising a digitizer 42, and peak detection and processing logic 44. The output of the peak detection logic 44 is passed to a buffer memory 46 and subsequently to a computer 48. The computer 48 is preferably connected to a display device 50 and performs other processing and display functions.

The PDM system 30 preferably provides at least two basic modes of operation for use in different applications. The basic modes are: (1) general purpose measurement and pulse display; and (2) time-dependent pulse capture. A pulse capture and analysis mode using varying windows is also described in the aforementioned co-pending applications. When operating in general purpose measurement and display mode, the PDM system 30 most closely mimics the operation of a traditional instrument. This mode is optimized to provide the fastest possible update rate on the system display 50 to allow the PDM system 30 to mimic the characteristics of an analog cathode-ray oscilloscope, for example.

Figure 5:
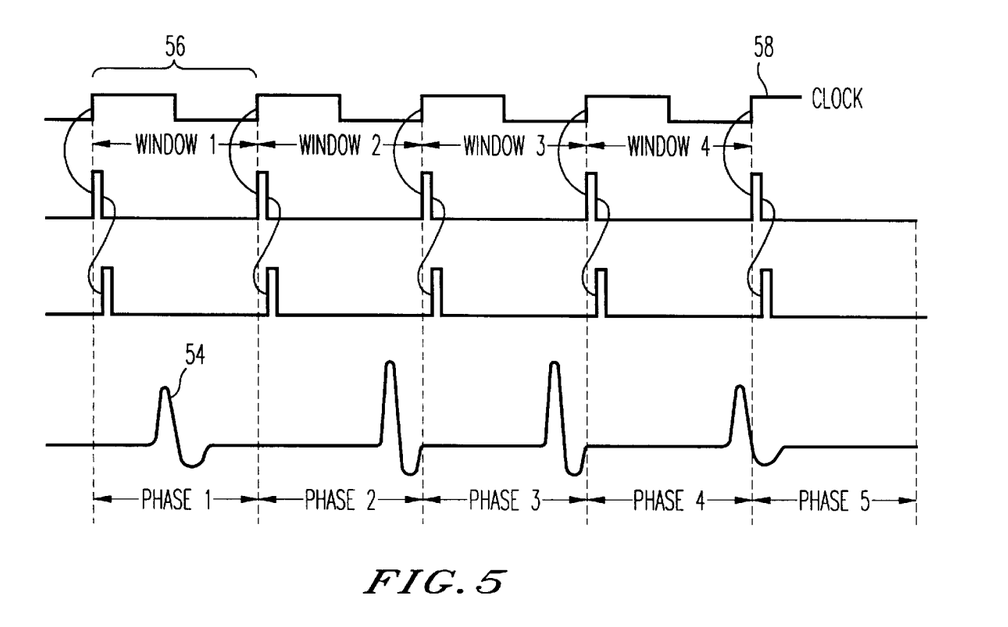
FIG. 5 illustrates the capture of data by the PDSL system in accordance with an embodiment of the present invention.

With reference to FIG. 5, individual pulses (e.g., pulse 54) are captured in fixed windows (e.g., window 56), taking into account the positive and negative peak magnitudes. The pulses are each stored in a capture memory based on their position in the cycle of a clock signal 58, and the number of cycles that have elapsed since the last time the capture memory was read. Having the phase implicit in the position of a pulse in the capture memory simplifies the process of writing the individual pulses onto the system display 50 by minimizing the calculation required. Where pulses occur so close together that they occupy a single phase position 56, the PDM system 30 records the highest pulse and indicates the highest pulse on the system display 50. This avoids the PDM system 30 having to write a pulse to the display 50, only to draw over the current display with a larger pulse. This mode guarantees that the highest discharge magnitude pulse is measured, but does not guarantee to resolve all pulses under all situations. In other words, multiple pulses occurring in one window 56 yields one result, while a single pulse crossing two windows yields two results. This mode does, however, provide a fast update rate (e.g., typically 25 times per second) combined with an accurate discharge magnitude measurement. The display produced looks like that on an analog display, in that it is bipolar and can display the overshoot on a pulse (i.e., a pulse occurring concurrently with the tail of another pulse). This makes the PDM system 30 comfortable for a user used to traditional instruments. The pulse capture and analysis mode is preferred over the general operation mode when it is required to look at the statistics of discharge activity. For example, when discharge fingerprinting is to be performed, all of the pulses in a defined interval can be captured via the pulse capture and analysis mode. Nonetheless, the general purpose mode is advantageous for capturing the overshoot of the pulses to provide a more realistic display.

The second mode of operation, that is, the time-dependent pulse capture mode, is the simplest mode of operation. Once the PDM system 30 is triggered in this mode (i.e., using fixed time windows as shown in FIG. 5), the PDM system 30 fills up a pulse capture memory with successive samples taken from the digitizer 42. In this mode, no attempt is made to capture the peaks of the pulses. Accordingly, no measurement of discharge magnitude is made. The primary use of this mode is for fault location in cables. The position of pulses within the cable 10 can be found by measuring the time interval between a pulse and its reflection. By comparison with the time for a pulse to travel the full length of the cable 10 and return to an originating point (e.g., measuring point 24), the position of the fault 16 from the far end 22 of the cable 10 can be determined. This mode also provides diagnostic facilities because it allows the pulse shape to be studied to optimize the bandwidth of the system. Also, because of the time-based capture, this mode allows the measurement of interference frequencies such that suitable filtering can be implemented.

The computer 50 in the digital discharge detection PDM system 30 is preferably a personal computer, for example. The computer 48 is figured to allow flexible test recording and data exporting to different software programs such as Word™ and Excel™ The computer 48 is programmed to provide a flexible analysis tool for digital partial discharge detection. Pulse capture is achieved against phase or time coordinates. Different modes of operation are provided for full control over gating of pulses in both the vertical and horizontal axes. FPGA technology is preferably used for peak detection and operations (i.e., peak detection logic 44) in conjunction with the central processing unit board of the computer 48. Pulses from the amplifier 36 are provided to the FPGA peak detector 40 which comprises a digitizer 42 (hereinafter referred to as an analog-to-digital converter (ADC)). The ADC 42 is preferably a 10-bit ADC to provide 9-bit resolution a sign bit. As described in the co-pending applications, the output of the ADC 42 is provided to a two-stage pipeline comprising an ADC buffer and a peak buffer. The values in these buffers represent two stages in a pipeline and are provided to a magnitude comparator. A state machine controller in the peak detection logic 44 provides gate control to determine the time window within which peak detection is performed. The state machine also controls the clocking of the pipeline and resetting of values in the pipeline.

Automated Cable Length Calibration

Before PDSL measurements are taken, the propagation time of a pulse travelling the full length of the cable is related to the length of the cable 10, in accordance with the present invention. A calibration pulse is injected into the near end 24 of the cable 10 (i.e., at the measuring point). The calibration pulse (CP) preferably does not energize the cable 10 sufficiently for discharge activity to occur at faults, should any faults exist in the cable. The time difference between the injection of the CP and the first reflection thereof (CP') is measured. The factor to relate the time difference between a PP and its reflection (i.e., FR) to the distance of the fault site 16 from the far end 22 of the cable 10 is obtained from the time difference between the calibration pulse (CP) and its reflection (CP') from the far end 22 of the cable 10.

To automatically calibrate, the PDSL system 12 can be used to provide calibration pulses to the near end 24 of the cable 10 and to trigger the PDSL capture of the system. Since the PDSL capture in the PDM system 30 does not occupy a full cycle of the power source 32, the PDM 30 is operable to ensure that the PDSL capture has a calibration pulse in it. Thus, the PDM system 30 is advantageous in that is it configured to allow the starting phase of the PDSL capture to be set and the phase position to be known. An important aspect of the calibration of the PDSL system 12 is that the pulse is visible above the noise.

To perform automatic length calibration, the PDSL system 12 runs in the general measurement and pulse display mode, using the amplifier 36 to measure the background noise level of the system. The level is recorded, as indicated in block 60 in FIG. 6. The PDSL system 12 is programmable to commence calibration after the computer 48 has determined that a CP is introduced with a peak height of at least 50% greater than the recorded background noise level (block 62). With reference to block 64, the PDSL system 12 then preferably switches to the time-dependent pulse capture mode (hereinafter referred to as the PDSL mode) and triggers a series of captures (block 66). The data from multiple captures is combined as described below in connection with FIG. 6.

Figure 6:
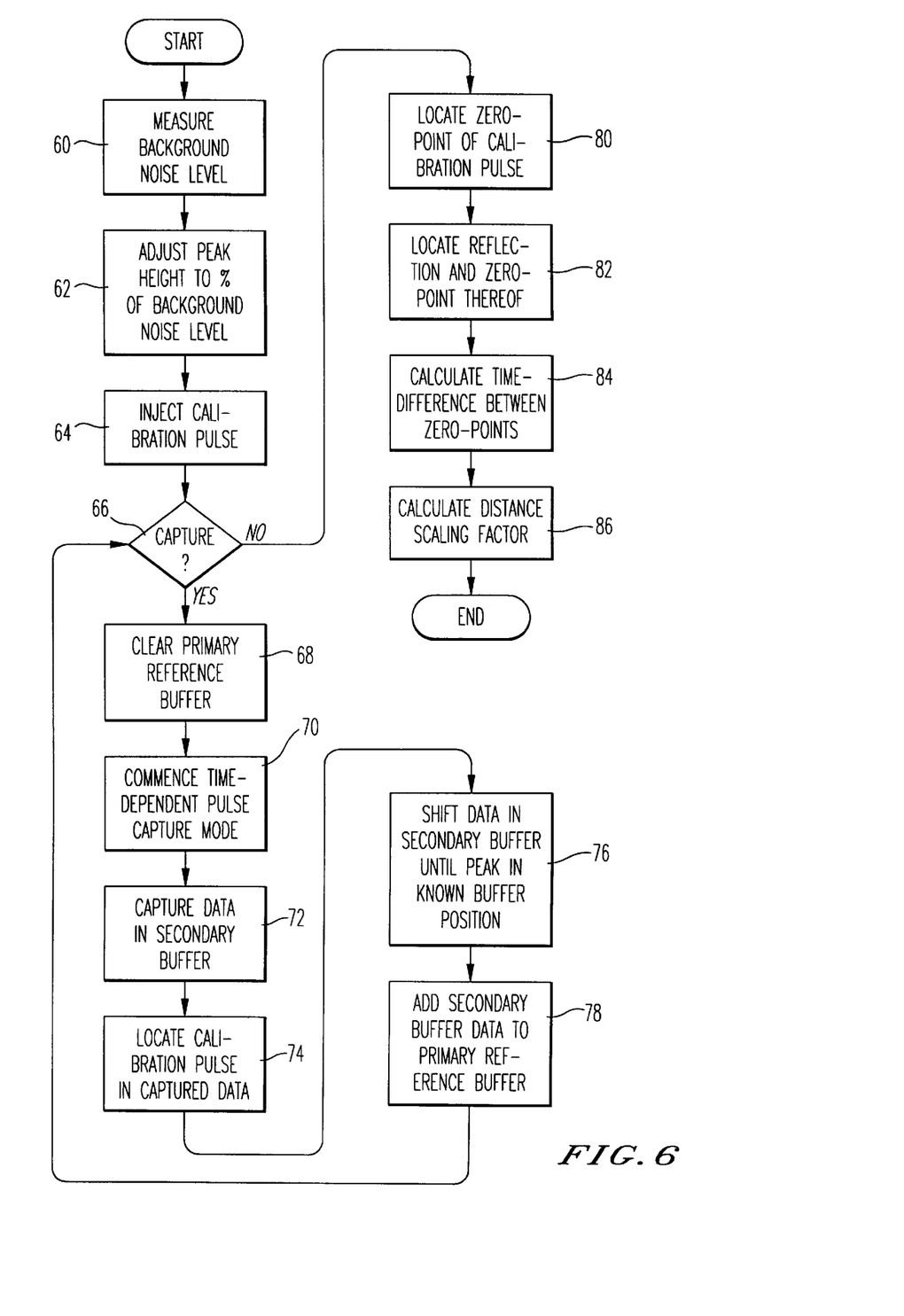
FIG. 6 is a flow chart depicting a sequence of operations for calibrating a PDSL system and for determining a distance scaling factor in accordance with an embodiment of the present invention.

In accordance with the present invention, the PDSL system 12 is programmed via the peak detection logic 44 to establish a primary reference buffer in the buffer memory 46 and to clear the primary reference buffer (block 68). PDSL measurement is commenced in the PDSL mode. Accordingly, data is captured into a second buffer in the buffer memory 46 (blocks 70 and 72). The data represents a time-based series of data points that provide ADC output at a particular instant.

The PDSL system 12 searches the data in the secondary buffer until the peak of the calibration pulse is located, which is the highest value point recorded in the secondary buffer (block 74). The data in the secondary buffer is shifted until this peak value is stored at a predetermined position or register in the buffer (e.g., 10% into the buffer), as indicated in block 76. This eliminates problems due to jitter or synchronization drift by repositioning the peak to a known point. The data in the secondary buffer is added to that in the primary buffer (block 78). The process is repeated a number of times (e.g., between 50 and 100 times) to ensure that all non-correlated noise sources in the pulse stream (e.g., TIPs or RFI) are eliminated. With reference to FIG. 2, the CP, its reflection CP', as well as TIPs and SHORs, occur at similar time intervals t corresponding to the length l of the cable 10.

With continued reference to FIG. 6 and the negative branch of decision block 66, the PDSL system 12 searches for the zero point of the CP in the secondary buffer and notes the CP position (block 80). The CP in FIG. 2 is illustrated as the first pulse φ[A]. The PDSL system 12 subsequently scans the secondary buffer for the CP reflection CP', assuming the reflection CP' is the second highest pulse (i.e., neglecting the first highest pulse CP). The PDSL system 12 determines the zero point of the reflection CP' and the corresponding position of the zero value in the secondary buffer (block 82). The reflection CP' is illustrated in FIG. 2 as the second pulse φ[B]. The time difference between the CP and its reflection CP' is calculated (block 84), and a distance scaling factor is calculated from that time difference (block 86). For example, the distance scaling factor can be l/t where the length l of the cable is known and the time difference is calculated. The distance scaling factor l/t is also equivalent to (l×f)/n wherein f is the sampling frequency in the PDSL mode and n is the number of samples taken between pulses φ[A] and φ[B]. The automatic calibration described in connection with FIG. 6 need not be used to scale measurements if the cable propagation velocity is known.

Data Acquisition and Processing

Once the PDSL system 12 has been calibrated, the PDSL system 12 is prepared to perform data acquisition and processing operations, which are described below in connection with FIGS. 7 and 8. The PDSL system 12 preferably captures data over a predefined number of acquisitions, set by the user or some suitable default setting. The amount of data that is gathered is a compromise between obtaining a sufficient amount of data to ensure that the full length of the conductor 10 is measured, and avoiding the capture of an excessive amount of data and increased processing time. The computer can determine the amount of data based on the amount of memory left after the PP is detected. The user can override the computer-determined amount if the user can estimate how much data is necessary, based on experience of the transit time or propagation speed of a particular type of conductor or cable. For example, the PDM system 30 can capture 0.25 Megabytes (MB) of information on each capture. Since, at a line frequency of 60 Hz, an whole entire power mains cycle may not be covered, it is necessary for the PDSL system 12 to know where on the mains cycle the data capture process is to start to ensure digitizing of valid discharge pulses. The starting point can be determined from the pulse information gathered while operating in the pulse display mode.

Figure 7:
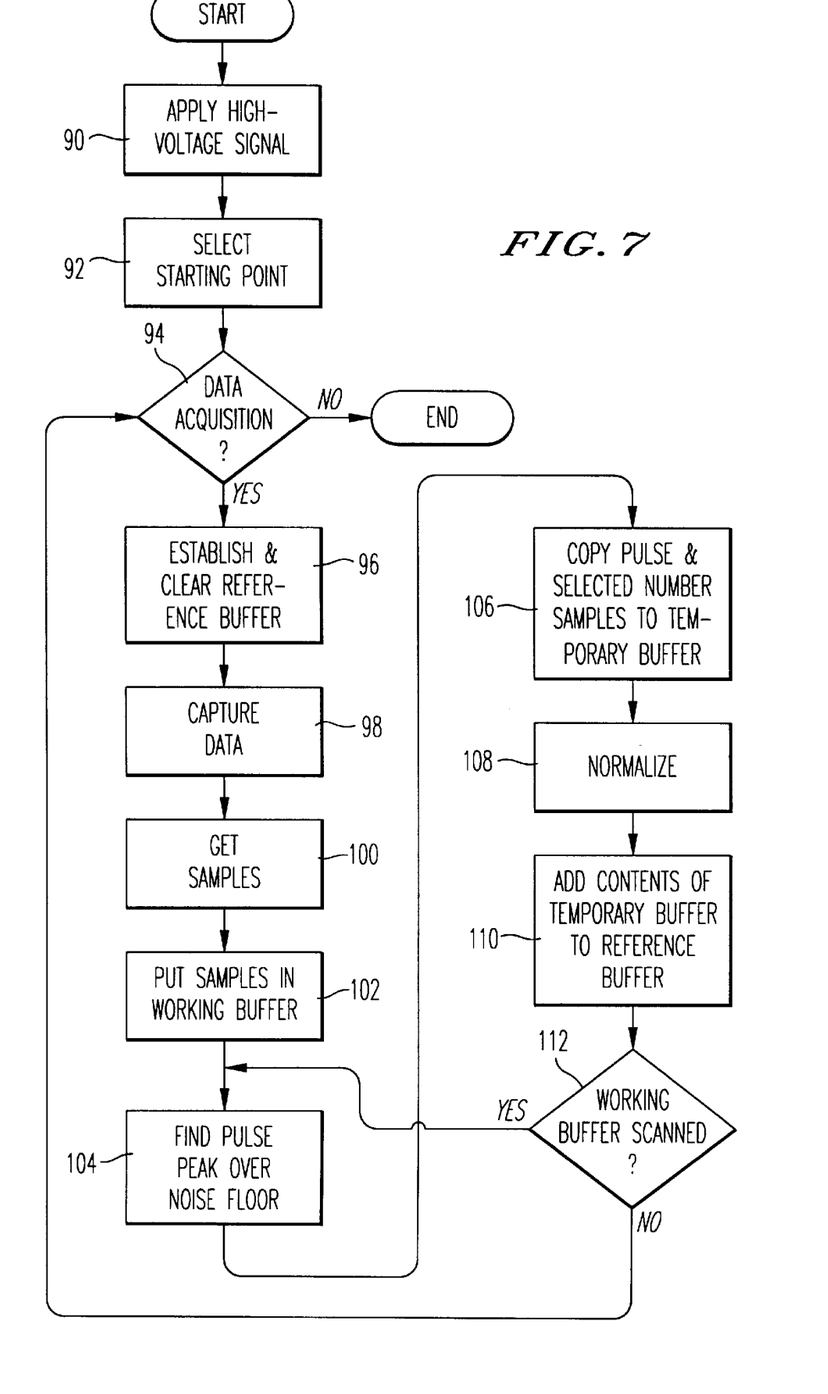
FIG. 7 is a flow chart depicting a sequence of operations for data acquisition via a PDSL system in accordance with an embodiment of the present invention.

After calibration, a high voltage signal is applied to the cable 10 which is sufficient for the cable 10 to discharge at any fault sites 16 therein (block 90 of FIG. 7). This high voltage energization can be generated, for example, using the aforementioned series 970 controller connected to, or incorporated in, the PDSL system 12. If the PDSL system 12 is using a series 970 controller or similar device, there are at least two possibilities for applying voltage. First, a voltage level defined by the user or the PDSL system 12 can raise the voltage until a level of activity defined by the user is achieved. Once a voltage is achieved whereby the sample discharge occurs, the voltage is preferably held until testing is completed.

Once the sample 10 is at a selected voltage for discharging, the starting point for digitization is determined (block 92). The starting position can be determined automatically if the discharge activity is visible over the background noise. It is to be understood that only the primary pulses (PPs) need to be visible. Alternatively, the user can indicate the starting position of the data capture sequence. For example, the user can set the starting position by observing the position of discharge activity on the normal phase-related discharge display and choosing an appropriate value. Once a starting point is established, the PDSL system 12 commences the data acquisition process (block 94). Data acquisition preferably involves a defined number of capture phases, the number of which can be set by the user. The higher the number of captures, the more statistically relevant the captured data is.

Figure 8:
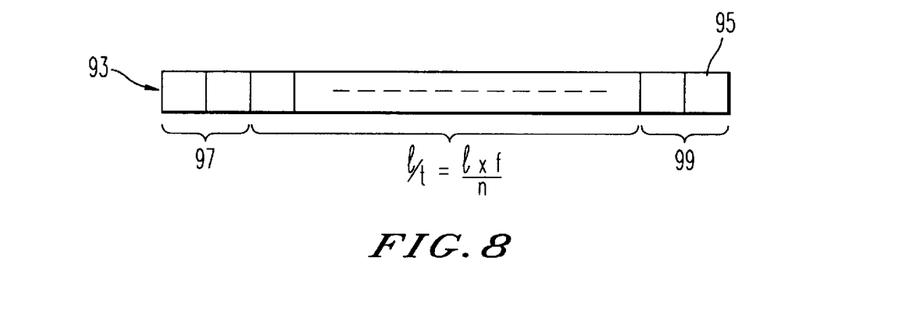
FIG. 8 depicts a buffer constructed in accordance with an embodiment of the present invention.

The PDSL system 12 establishes a reference buffer 93 for the final gathered data which is illustrated in FIG. 8. The reference buffer 93 is sized according to the time difference between a calibration pulse and its reflection as measured during the calibration phase (FIG. 6). The use of the distance scaling factor determined during calibration ensures that the data buffer 93 corresponds to the length of the cable 10, in addition to small guard bands 97 and 99 of registers 95 added onto each end of the buffer 93. The contents of this reference buffer are set to zero, as indicated in block 96 of FIG. 7. For each of the data captures, the PDSL system 12 performs a sequence of operations. After the PDSL system 12 commences the capture mode, as indicated in the decision block 98, the PDSL system 12 stores output values from the digitizer 42 (e.g., 10-bit representations of a waveform processed via an analog-to-digital converter) and continues to store values until 256K samples have been captured in the buffer memory 46 (block 100). The data from the PDSL capture is transferred into a working buffer in the buffer memory 46 (block 102). The system scans along the working buffer until it finds a pulse that exceeds the noise floor of the system (block 104). The PDSL system 12 locates the peak of that pulse. Once the peak has been found, the corresponding pulse is copied into a temporary buffer, along with a number of samples following the pulse (block 106). The number of the samples following the pulse, which are stored in a temporary buffer in the buffer memory 46, corresponds to the size of the reference buffer and therefore the length of the cable. The entries in the temporary buffer are normalized to make the magnitude of the first pulse unity (block 108). The entries in the temporary buffer are added to the corresponding entries in the reference buffer (block 110). The data in the working buffer continues to be scanned and processed as described with reference to blocks 104, 106, 108, 110 until the entire working buffer is scanned (block 112).

Once the data acquisition process has been performed, the reference buffer holds a sequence of data that represents the activity within the length of the cable.

Analysis of the Reference Buffer Data

Figure 9:
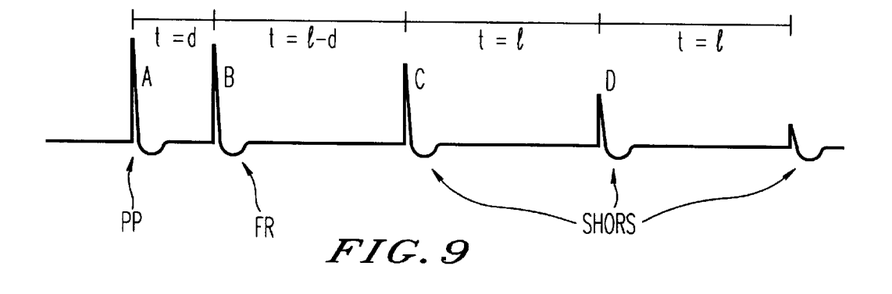
FIGS. 9 and 10 illustrate pulses detected on a conductor by a PDSL system and their representation in a reference buffer in accordance with an embodiment of the present invention.

Once the reference buffer (e.g., buffer 93 in FIG. 8) has been filled, it can be analyzed to identify activity within the cable. The contents of the reference buffer represent a statistical average of the history of pulses over the time that elapsed while the pulses traveled the full length of the cable 10. With reference to FIG. 9, a number of pulses A, B, C and D traveling along the cable 24 and measured by the PDSL system 12 at the measuring end 24 are depicted in FIG. 9. The pulses A, B, C and D are also depicted individually in FIG. 10, along with the history of the pulses 120 as represented in the reference buffer. For illustrative purposes, the pulse B occurred at a time interval corresponding to the distance d on the cable, as depicted in FIG. 1. The pulses C and D each occurred at a time interval corresponding to l or the length of the table.

Figure 10:
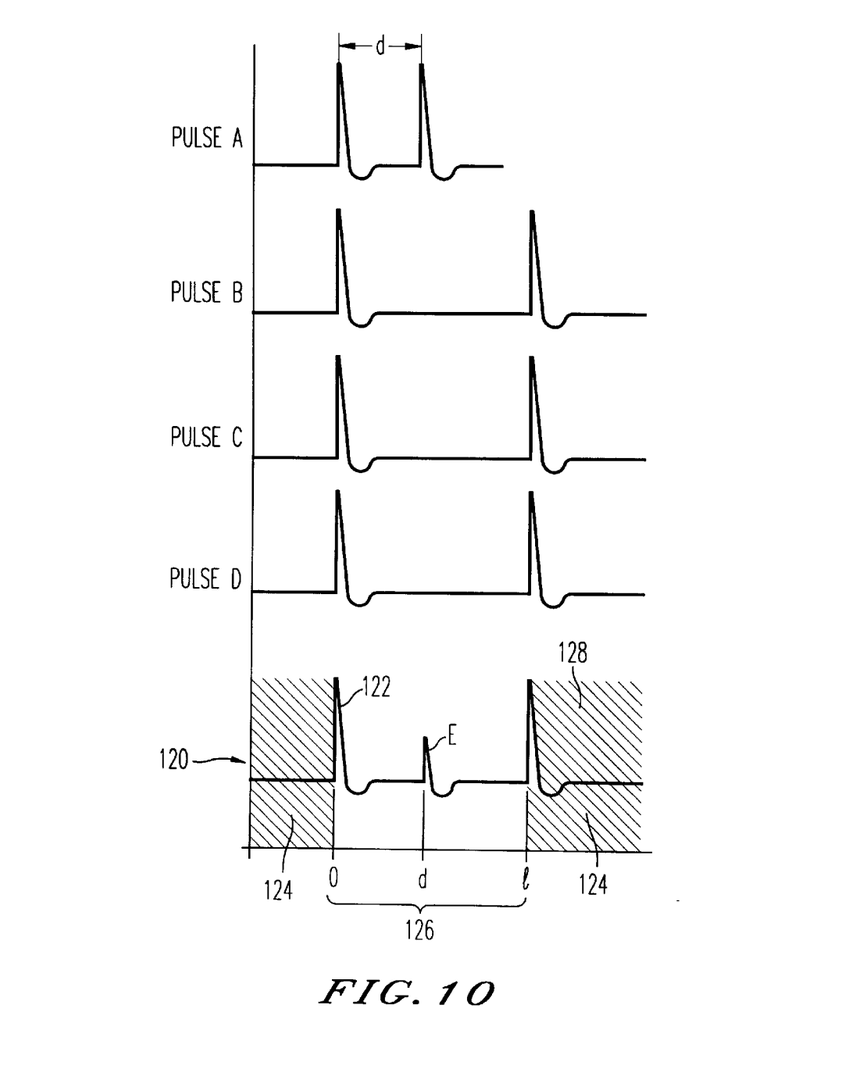

The data detected at the near end or measuring point 24 of the cable 10 is depicted on the left of the raw data shown in FIG. 9. The contents of the reference buffer provide a plot of activity along the length of the cable, as indicated at 120 in FIG. 10. The contents in the reference buffer corresponding to data at the measuring end 24 of the cable 10 essentially always comprises a pulse 122 which is the statistical sum of all of the pulses (e.g., pulses A, B, C and D) recorded during the data acquisition phase. The shaded area 124 in FIG. 10 represents the environment external to the cable, while the unshaded area corresponds to activity in the cable 10.

If the attenuation of the cable is low, there is the possibility of SHORs occurring. SHORs appear on the final result 120 in the reference buffer as a contribution to the pulse 122 at the start of the reference buffer and a corresponding pulse 128 at the far end of the buffer. This is so because, as stated previously, SHORs are spaced in accordance with the time corresponding to propagation of a pulse along the length of the cable. SHORs are therefore spaced apart or separated in time by this same amount. TIPs appear in the same way as they manifest on either one end 22 of the cable 10 or the other end 24.

The effect of SHORs and TIPs, therefore is to accentuate the height of the pulse 122 at the start of the reference buffer and to produce a pulse 128 on the end of the buffer, thereby indicating the start and the finish points of the cable 10, respectively. Because RFI, which does not correlate to the pulse activity on the sample, is averaged over the length of the cable for a large number of captures, RFI is seen as an offset of the data in the reference buffer. Thus, the effect of interferences are suppressed by the present invention.

The data of interest to most users are the PPs and FRs. The PPs (e.g., pulse A in FIGS. 9 and 10) occur at the start of the cable 10 and therefore accentuate the first pulse 122. The FRs (e.g., pulse B) differ from the interferences and other reflections in that they are not spaced from the PP by the length of the cable, but rather by some lesser amount d. As the statistical averages are obtained, the effect of the PPs and FRs is to place pulses (e.g., pulse E in FIG. 10) inside the cable and not just on the ends as with SHORs and TIPs. Accordingly, data corresponding to FRs, for example is contained somewhere in the reference buffer other than at the ends of the buffer. The FRs indicate fault sites 16. The location of the faults within the cable 10 therefore are indicated. Since the reference buffer length corresponds to the time elapsing as a pulse propagates along the length l of the cable, the time difference between the left side of the reference buffer and the pulse E indicates the distance d from the near end 24 of the cable or the distance x from the far end 22 of the cable. If no pulses are indicated between the ends of the buffer, a user can infer that a problem is close to the ends 22 and 24 of the cable 10, in the termination system at the far end 22 or external to the cable 10.

If the PDSL system 12 is operating with a series 970 system controller, the user needs only enter the voltage at which the cable is to be tested, the number of capture cycles to be performed and either the length of the cable or its velocity of propagation. These parameters can be embedded in a test specification loaded from a file into the PDSL system 12. Once the PDSL system 12 has the required information, a test can be performed by pressing a button and waiting for the data to be produced. Thus, no intervention by the user is required. If the number of captures is sufficient to average out the non-correlated noise on PDSL system 12, the PDSL system can automatically locate the position of multiple faults within the cable 10, allowing the system to be used by unskilled operators with minimal training.

When multiple faults exist within the cable 10, it is likely that their respective discharge rates differ. Thus, the relative frequency of occurrence of the pulses is different and therefore the heights of the corresponding averaged pulses are different. Because the data are normalized based on the height of the primary pulse, there is no effect on the height of the first reflection pulses seen on the trace of the PDSL system display 50 as a result of differences in discharge magnitude. In the reference buffer, the height of pulses within the cable 10 are dependent on two factors, that is, the relative frequency of occurrences and the attenuation of the cable. In accordance with the PDSL system of the present invention, the effect of cable attenuation is proportional to the distance of the fault from the far end of the cable. Thus, it is possible to determine the attenuation per unit length of cable from the relative height of the calibration pulse and its reflection. By applying this correction to the reference buffer, the height of pulses corresponding to faults within the cable is proportional to the relative frequency of occurrence, indicating the level of activity of the faults.

Although the present invention has been described with reference to a preferred embodiment thereof, it will be understood that the invention is not limited to the details thereof. Various modifications and substitutions have been suggested in the foregoing description, and others will occur to those of ordinary skill in the art. All such substitutions are intended to be embraced within the scope of the invention as defined in the appended claims.

What is claimed is:

1. A method for determining the location of faults along an electrical conductor having a near end and a far end comprising the steps of:

applying a voltage signal to the near end of said electrical conductor to energize said electrical conductor sufficiently for discharging at any said fault therein, said electrical conductor being operable to propagate at least one of a plurality of pulses comprising a primary pulse originating at any said fault in response to the excitation of the electrical conductor by said voltage signal and traveling toward the near end of said electrical conductor, a first reflected pulse corresponding to the reflection of said primary pulse at the far end of said electrical conductor, a second order pulse and a higher order pulse corresponding to the reflection of said first reflected at a corresponding one of the near end and the far end of said electrical conductor, and a transient interference pulse coupled to said electrical conductor via the environment surrounding said electrical conductor;

storing data relating to the length of said electrical conductor, said data being selected from the group consisting of the propagation time for at least one of said first pulse and said plurality of pulses to travel along said electrical conductor, the length of said electrical conductor, and velocity of said at least one of said primary pulse and said plurality of pulses traveling along said electrical conductor;

establishing a reference buffer corresponding to the length of said electrical conductor using said data;

initializing said reference buffer to zero;

obtaining a plurality of samples from said electrical conductor corresponding to the amplitude of any of said plurality of pulses;

storing said plurality of samples in a working buffer;

scanning said plurality of samples in said working buffer to locate a first one of said plurality of pulses having an amplitude level that is greater than a predetermined signal level;

storing selected ones of said plurality of samples as respective entries in a temporary buffer, said selected samples comprising samples corresponding to said first one of said plurality of pulses and subsequent ones of said plurality of samples stored in said working buffer, the number of said selected samples corresponding to the length of said electrical conductor;

normalizing said entries in said temporary buffer such that the magnitude of said first one of said pulses is unity;

adding said entries in said temporary buffer to corresponding entries in said reference buffer; and repeating said obtaining step, said storing step for storing said plurality of samples, said scanning step, said storing step for storing said selected samples, said normalizing step and said adding step, said entries in said reference buffer representing a statistical average of said pulses during a period of time corresponding to the amount of time required for one of said pulses to travel the length of said electrical conductor.

2. A method as claimed in claim 1, wherein said temporary buffer comprises entries for storing data relating to said plurality of samples, said storing step for storing said selected samples in said temporary buffer comprises the step of providing said selected samples occurring at the near end and the far end of said electrical conductor in said temporary buffer at corresponding ones of entries located at the beginning and at the end of said temporary buffer and the remaining said selected samples being stored in consecutive order using said entries between the first and the last of said entries.

3. A method as claimed in claim 2, wherein said providing step comprises the step of providing a selected number of entries prior to and after said entries located at the beginning of and at the end of said temporary buffer, respectively, to operate as guard bands with respect to said selected samples.

4. A method as claimed in claim 1, wherein said repeating step is performed a predetermined number of times to define a selected data acquisition period, and further comprising the step of analyzing said electrical conductor using said entries in said reference buffer, one of said entries in said reference buffer corresponding to the statistical sum of all of said pulses captured via each said repeating step during said data acquisition period.

5. A method as claimed in claim 4, wherein said one of said entries corresponding to said statistical sum is located at least proximally with respect to said entries located at the beginning of and at the end of said reference buffer, said analyzing step comprising the step of analyzing said entries in said reference buffer as representing different ones of said plurality of pulses at respective portions along the length of said electrical conductor.

6. A method as claimed in claim 1, further comprising the steps of:

identifying said first reflected pulse corresponding to each said fault on said electrical conductor as a corresponding one of said entries that is not proximal with respect to the beginning of and the end of said reference buffer and has a selected magnitude; and determining the location of each said fault on said electrical conductor by correlating the location of the corresponding said entries indicating each said first reflected pulse with respect to a point along the length of said electrical conductor.

7. A method as claimed in claim 6, wherein said electrical conductor can be subjected to radio frequency interference, further comprising the step of disregarding different ones of said plurality of pulses relating to either of transient interference pulse and radio frequency interference since they are indicated at the beginning of and at the end of said reference buffer.

8. A method as claimed in claim 6, wherein said electrical conductor can be subjected to radio frequency interference, further comprising the step of identifying radio frequency interference with respect to said electrical conductor as an offset value with respect to said selected samples in said reference buffer.

9. A method as claimed in claim 6, further comprising the step of determining if any of said second order pulse, said higher order pulse, and said transient interference pulse occurred using said entries at the beginning of and at the end of said reference buffer.

10. A partial discharge site location system for locating faults along the length of an electrical conductor comprising:

a power supply device for energizing said electrical conductor;

a partial discharge measurement system connected to said electrical conductor and operable to identify individual pulses occurring on said electrical conductor, said pulses corresponding to discharge at any fault sites along said electrical conductor as a result of energization by said power supply device, said partial discharge system comprising a processor, a memory device, and an analog-to-digital converter, said processor being programmed to perform a pulse capture operation to represent said pulses as digitized samples of pulse amplitudes from said analog-to-digital converter, said digitized samples being stored in said memory device; and a processing device programmed to perform at least one of a plurality of operations comprising a calibration operation to relate the propagation time of one of said pulses traveling the entire length of said electrical conductor to the length of said electrical conductor, and a data acquisition operation wherein said digitized samples from said pulse measurement system are obtained, said processing device being programmed in accordance with said data acquisition operation to create a reference buffer corresponding to the length of said electrical conductor, to store said digitized samples from one said pulse capture operation in a working buffer, to scan said working buffer to locate said digitized samples corresponding to peaks of pulses above a selected noise level and store said digitized samples corresponding thereto into a temporary buffer along with a selected number of said digitized samples acquired thereafter, normalizing said digitized samples in said temorary buffer, and adding said digitized samples in said temporary buffer to said reference buffer.

11. A partial discharge site location system as claimed in claim 10, wherein said processing device is programmed to repeat said data acquisition operation a selected number of times to obtain a statistical average of pulse activity along said electrical conductor in said reference buffer, first reflections of a discharge pulse from any fault along said electrical conductor being identified in between the beginning and the end of said reference buffer.

* * * * *